United States Patent
Clark et al.

(10) Patent No.: US 6,982,240 B1
(45) Date of Patent: Jan. 3, 2006

(54) METHOD FOR MAKING A SUPERCONDUCTOR DEVICE

(75) Inventors: Gregory John Clark, Katonah, NY (US); Richard Joseph Gambino, Yorktown Heights, NY (US); Roger Hilsen Koch, Amawalk, NY (US); Robert Benjamin Laibowitz, Peekskill, NY (US); Allan David Marwick, Yorktown Heights, NY (US); Corwin Paul Umbach, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 07/751,287

(22) Filed: May 9, 1991

Related U.S. Application Data (60) Continuation of application No. 07/361,168, filed on Jun. 5, 1989, now abandoned, which is a division of application No. 07/037,912, filed on Apr. 13, 1987, now Pat. No. 5,026,682.

(51) Int. Cl.
- *H01L 39/24* (2006.01)
- *H05H 1/00* (2006.01)
- *B05D 5/12* (2006.01)

(52) U.S. Cl. .................. 505/300; 505/325; 505/480; 505/725; 427/62; 427/533; 427/555

(58) Field of Classification Search .......... 501/1, 501/701, 702, 730, 732, 300, 325, 480, 725; 427/38, 62, 63, 53.1, 533, 555; 357/5; 324/248; 437/910
See application file for complete search history.

(56) References Cited

U.S. PATENT DOCUMENTS

| | | | |
|---|---|---|---|
| 4,025,844 A | 5/1977 | Deutscher | 324/43 R |
| 4,037,102 A * | 7/1977 | Hoyle et al. | 250/336 |
| 4,490,901 A | 1/1985 | Clark et al. | 29/574 |
| 4,586,062 A | 4/1986 | Bouffard et al. | 357/5 |
| 4,589,001 A * | 5/1986 | Sakai et al. | 357/5 |

FOREIGN PATENT DOCUMENTS

| | | |
|---|---|---|
| EP | 0088666 | 9/1983 |
| EP | 0304807 | 3/1989 |
| EP | 0311331 | 4/1989 |
| JP | 57 20486 | 2/1982 |
| JP | 57020486 * | 2/1982 |
| JP | 57126181 | 8/1982 |
| JP | 57153482 | 9/1982 |
| JP | 58 12382 | 1/1983 |
| WO | 88 08207 | 10/1988 |

OTHER PUBLICATIONS

Harris et al, *IBM Tech. Discl. Bull.*, vol. 17, No. 2, Jul. 1974, p. 604.*

(Continued)

*Primary Examiner*—Brian K. Talbot
(74) *Attorney, Agent, or Firm*—Daniel P. Morris

(57) ABSTRACT

A superconducting device operable at temperatures in excess of 30° K. and a method for making the device are described. A representative device is an essentially coplanar SQUID device formed in a single layer of high $T_c$ superconducting material, the SQUID device being operable at temperatures in excess of 60° K. High energy beams, for example ion beams, are used to convert selected portions of the high $T_c$ superconductor to nonsuperconductive properties so that the material now has both superconductive regions and nonsuperconductive regions. In this manner a superconducting loop having superconducting weak links can be formed to comprise the SQUID device.

15 Claims, 4 Drawing Sheets

OTHER PUBLICATIONS

E. P. Harris et al., *IBM Technical Disclosure Bulletin*, vol. 17, pp. 257-258 (Jun. 1974).

E. P. Harris et al., *IBM Technical Disclosure Bulletin*, vol. 17, p. 604 (Jul. 1974).

G. W. Webb and J. J. Engelhardt, *IEEE Transactions on Magnetics*, vol. Mag-11, pp. 208-213 (Mar. 1975).

A. W. Sleight et al., *Solid State Communications*, vol. 17 pp. 27-28 (1975).

W. Buckel, *Supraleitung/Grundlagen und Anwendungen*, (Physik Verlag; Weinheim, Germany; 1977) pp. 69-85, 282-295 (No Translation).

L. R. Gilbert et al., *Thin Solid Films*, vol. 54, pp. 129-136 (1978).

L.R. Gilbert et al., *Journal of Vacuum Science and Technology*, vol. 17, pp. 389-391 (Jan./Feb. 1980).

R.F. Voss et al., *Journal of Applied Physics*, vol. 51, pp. 2306-2309 (Apr. 1980).

M. Suzuki et al., *Japanese Journal of Applied Physics* vol. 19, pp. L231-L234 (May 1980).

J. Clarke, *IEEE Transactions on Electron Devices*, vol. ED-27, pp. 1896-1908 (Oct. 1980).

C.C. Chi et al., *IBM Technical Disclosure Bulletin*, vol. 23, pp. 3415-3417 (Dec. 1980).

T.D. Thanh et al., *Applied Physics*, vol. 22, pp. 205-212 (1980).

*CRC Handbook of Chemistry and Physics*, 60th ed. (Chemical Rubber Co., Cleveland, 1980) p. E-88.

T. Inamura et al., *Japanese Journal of Applied Physics*, vol. 21, Supplement 21-1, pp. 313-318 (1982).

M. Suzuki et al., *Journal of Applied Physics*, vol. 53, pp. 1622-1630, (Mar. 1982).

M. Ito et al., *Japanese Jornal of Applied Physics*, vol. 21, pp. L375-L376 (Jun. 1982).

M. Suzuki et al., *Japanese Journal of Applied Physics*, vol. 21, pp. L437-439 (Jul. 1982).

R.J. Gambino, unpublished manuscript for *IBM Technical Disclosure Bulletin*, submitted Aug. 27, 1982.

M. Ito et al., *Applied Physics Letters*, vol. 43, pp. 314-316 (Aug. 1, 1983),

H. Hayakawa, *Physics Today* / Mar, 1986, pp. 46-50, 52.

C.W. Chu et al., *Physical Review Letters*, vol. 58, pp. 405-407 (Jan. 26, 1987).

R.J. Cava et al., *Physical Review Letters*, vol. 58, pp. 408-410 (Jan. 26, 1987).

M.K.Wu et al., *Physical Review Letters*, vol 58, pp. 908-910 (Mar. 2, 1987).

T. Naegele, *Electronics* / Apr. 2, 1987 pp. 49, 51.

R.H. Koch et al., *Applied Physics Letters*, vol. 51, pp. 200-202 (Jul. 20, 1987).

M. Rothschild et al., *IEEE Electron Device Letters*, vol. 9, pp. 68-70 (Feb. 1988).

T. Murakami et al., four page article entitled "New Devices Using Superconducting $BaPb_{0.7}Bi_{0.3}O_3$(BPB) Thin Films" (undated).

* cited by examiner

METHOD FOR MAKING A SUPERCONDUCTOR DEVICE

CROSS-REFERENCES TO RELATED APPLICATIONS

This application is a continuation of U.S. patent Ser. No. 07/361,168, now abandoned which is a Divisional of U.S. patent Ser. No. 07/037,912, filed Apr. 13, 1987 now U.S. Pat. No. 5,026,682.

BACKGROUND OF THE INVENTION

1. Field of the Invention

This invention relates to novel devices and methods for making these devices using high $T_c$ superconductors, the superconductors exhibiting superconductivity at temperatures greater than 30° K., and more particularly to substantially planar high $T_c$ SQUID devices and methods for making these devices.

2. Description of the Related Art

Superconductivity is usually defined as the complete loss of electrical resistance of a material at a well defined temperature. It is known to occur in many materials, including about a quarter of the elements of the periodic table and over 1000 alloys and other multi-component systems. Generally, superconductivity is considered to be a property of the metallic state of the material since all known superconductors are metallic under the conditions that cause them to be superconducting. A few normally non-metallic materials, for example, become superconducting under very high pressure, the pressure converting them to metals before they exhibit superconducting behavior.

Superconductors are known to be very attractive for many applications, and in particular high speed switching devices, such as Josephson type switches, high density packaging and circuit layouts. Superconductors are also used in different types of electronic instrumentation, and provide very accurate and sensitive magnetic susceptometers and magnetometers.

While the advantages of superconductors are quite obvious to scientists and engineers, the common disadvantage of superconductive materials is their very low transition temperature. This temperature is often called the critical temperature $T_c$, and is the temperature above which superconductivity will not exist. Usually, $T_c$ is on the order of a few degrees Kelvin. For many years, the composition having the highest known $T_c$ was $Nb_3Ge$ which exhibits a $T_c$ of about 23° K. A review of these materials is contained in M. R. Beasley et al, Phys. Today, 37 (10), 60 (1984).

In 1986, a significant technical breakthrough was reported by J. G. Bednorz and K. A. Mueller in Z. Phys. B-Condensed Matter, 64 pp. 189–193 (1986). This was the first major improvement in the superconducting transition temperature in the last decade. The materials described by Bednorz and Mueller were transition metal oxides which could include rare earth or near rare earth elements as well as alkaline earth element substitutions. They are layer-like crystalline structures often characterized by oxygen deficiencies. It is believed that the transition metal must be multi-valent while many choices can be made for the rare earth, near rare earth and alkaline earth elements. Examples of such materials include oxides in the La—Sr—Cu—O and Y—Ba—Cu—O systems. Another publication further describing these materials is J. G. Bednorz et al, Europhysics Letters, 3 (3), pp. 379–385 (1987). The class of materials first described by Bednorz and Mueller will be hereinafter referred to as high $T_c$ superconductors. This is the term generally used by those working in this field to describe these materials, the materials being characterized as transition metal oxides having superconducting transition temperatures greater than about 30° K.

Since the pioneering work of Mueller and Bednorz, there has been considerable technical activity to further develop these superconductors and to provide compositions having even higher critical transition temperatures. Reference is made to co-pending application Ser. No. 024,653 filed Mar. 11, 1987 and assigned to the present assignee, describing a single phase Y—Ba—Cu—O system exhibiting superconductivity at a temperature well above 77° K., and a method for making this composition. A representative composition described in this co-pending application has the formula $A_1M_2Cu_3O_y$, where A is Y, or a combination of Y, La, Lu, Sc or Yb; M is Ba, or a combination of Ba, Sr or Ca; and y is sufficient to satisfy the valence demands of the composition.

Further references describing these high $T_c$ superconductors, and particularly the La—Sr—Cu—O and Y—Ba—Cu—O systems are the following:

Cava et al, Phys. Rev. Letters, 58, 408 (1987);
Chu et al, Phys. Rev. Letters, 58, 405 (1987).

Another significant advance in the field of high $T_c$ superconductors was the first report of the successful fabrication of films of high $T_c$ compositions and specifically films belonging to the La—Sr—Cu—O and Y—Ba—Cu—O systems. These films were described Mar. 18, 1987 at the meeting of the American Physical Society in New York City, and will be further detailed in a paper by R. B. Laibowitz et al submitted for publication.

The general teaching of Laibowitz et al is a vapor deposition technique in which multiple metal sources are used to provide vapor transport of metal atoms to a substrate which is in an oxygen ambient. For example, electron beam heated sources are filled with the desired metals, e.g., La, Sr, and Cu, or Y, Ba, Cu. The rates of evaporation are adjusted to give the nominal desired composition at the substrate. Subsequent annealing in an oxygen atmosphere at about 900° C. is used to provide the desired stoichiometry.

These films and a more detailed description of the fabrication process are described in a co-pending application Ser. No. 027,584 filed Mar. 18, 1987, and assigned to the present assignee. The teaching of the copending application is herein incorporated by reference.

Although many scientific studies have been made concerning these new high $T_c$ superconductors in order to understand the physics and chemistry of these materials, no one heretofore has reported on devices and techniques for making devices using these high $T_c$ superconductors. In particular, there has been no report of the successful operation of devices comprised of these high $T_c$ materials, nor of techniques to make such devices having a substantially planar structure. Generally, superconducting devices utilize multi-layers of different materials and have a non-planar geometry. However, some materials, because of their polycrystalline structure, can include grain boundaries that provide potential barriers for the flow of electrons thereacross and can in this way be used as tunneling devices. Such devices are often called boundary layer Josephson junctions, and are described in the following references:

M. Ito et al, Japanese Journal of Applied Physics, 21 No. 6, pp L375–L376, June 1982

M. Ito et al, Appl. Phys. Lett. 43 (3), p 314, Aug. 1, 1983

T. Inamura et al, Japanese Journal of Applied Physic, 21, Supplement 21-1, pp. 313–318, 1982.

The devices described in these references occur because of the grain boundaries that result in the deposited films during their preparation. These references do not teach a way to process a deposited film in a manner to controllably produce superconducting and nonsuperconducting regions, and also do not show how to make devices such as SQUIDs.

Accordingly, it is a primary object of the present invention to provide substantially planar devices and methods for making these devices using high $T_c$ superconductor materials.

It is another object of this invention to provide a device that is operable at temperatures in excess of 30° F. and which is fabricated entirely of high $T_c$ superconducting materials.

It is another object of this invention to provide a technique for controllably creating superconducting, normal and insulating portions in a single layer or a bulk sample of high $T_c$ superconductor.

It is another object of this invention to provide 3D device structures in a single layer of high $T_c$ superconducting material, and methods for making these 3D devices.

It is another object of this invention to provide a SQUID device comprised of at least one weak superconducting link formed in high $T_c$ superconducting material.

It is another object of the present invention to provide a DC SQUID device that successfully operates at a temperature in excess of 60° K., and methods for making the same.

It is another object of this invention to provide a SQUID device comprised of high $T_c$ superconducting material, the SQUID device having a substantially planar configuration and operating at temperatures in excess of 60° K.

It is a further object of this invention to provide improved techniques for controllably producing localized regions of a high $T_c$ superconductor which are metallic and normal, (i.e., nonsuperconducting or insulating).

It is a further object of the present invention to provide a processing technique for locally changing the properties of a high $T_c$ superconductor in such a way as to be able to create devices in the superconductor without the requirement for using different materials and/or multiple layers etc. of the same or different material.

BRIEF SUMMARY OF THE INVENTION

The processing techniques of this invention will provide many different types of devices that are configured in a single piece of high $T_c$ superconductor that can be either a film or bulk material. These devices include meander lines, Hall structures, SQUIDS and transmission line patterns.

In particular, a novel, substantially planar DC SQUID can be fabricated in high $T_c$ material, the SQUID being operable at temperatures in excess of 60° K.

In the fabrication process, beams having sufficient energy to cause damage in high $T_c$ superconducting materials are used, in order to change the properties of these materials. This damage will, for example, change the properties of the material from superconducting to normal (i.e., nonsuperconducting) and even to a nonsuperconducting insulating state. Thus, a complete transition from crystalline to amorphous structure can be produced in order to leave portions of the composition superconducting while other portions are made insulating, having an amorphous structure.

A particularly good example of a beam to change the properties of a high $T_c$ superconductor is a directed beam of ions, such as oxygen, As, Kr, etc. ion beams which are directed to the high $T_c$ superconductor. It has been discovered that these materials are extremely sensitive to ion bombardment and can be made to undergo changes in their properties where the beam images the material. It has further been discovered that the ion bombardment technique seems to work even more successfully as the quality of the high $T_c$ superconductor increases. That is, where there is a substantial amount of the superconducting phase present in the composition, the effects of the ion beams become even more pronounced and it is more easy to produce well defined nonsuperconducting regions.

In a preferred embodiment, this technique has been used to define weak superconducting links in a superconducting loop that operates as a DC SQUID at temperatures in excess of 60° K. The weak links and the superconducting loop are coplanar portions of high $T_c$ superconducting material, while the surrounding portions of this material have been rendered nonsuperconducting by the impinging ion beam.

Using this technique, many types of devices and structures can be created, including 3D structures where insulating layers are formed between superconducting layers, there being devices formed in the superconducting layers.

These and other objects, features, and advantages will be apparent from the following more particular description of the preferred embodiments.

DESCRIPTION OF THE PREFERRED EMBODIMENTS

In the practice of this invention, devices are formed in high $T_c$ superconductor materials by impinging energy beams onto the superconductive material in order to locally damage and change its properties. The material can be either a layer or bulk material, and it can be changed from superconducting to normal (a metallic state) or from superconducting to an insulating state. The mechanism for this change is a damage-inducing one in which the crystalline structure of the high $T_c$ superconductor is altered by the beam. In Applicants' experimentation, it was discovered that the sensitivity of these materials to incoming energy is very high, so much so that approximately 10 eV per atom of deposited energy is sufficient to cause a crystalline—amorphous transition in order to change the superconducting metallic material to a nonsuperconducting insulating state. At a smaller threshold, the superconducting material can be made to have normal properties, i.e. it is not superconducting, but does retains its metallic state.

In a preferred embodiment, the beam is an ion beam, the types of ions that can be used being numerous. These ions include, for example, oxygen, arsenic, and krypton. Generally, the heavier the ion, the more damage that will be caused and the less the dose required to cause a given amount of damage.

It is also been discovered that, as the percentage of the superconducting phase in these high $T_c$ materials increases, the more susceptible they are to ion beam damage. It appears that the presence of a conducting second phase creates regions in the high $T_c$ superconductor which are not easily ion damaged. If the amount of these second phase regions is minimal and/or if these second phases are not connected, the superconducting material can be bombarded to easily change its superconducting properties. If, however, a large percentage of the second phase is present, it has been found that very large doses and/or heavy ions are necessary to succcessfully change the properties of the superconducting material. Fortunately, as the quality of the material increases so does its ability to be locally altered by these ion beams.

Figure 1:
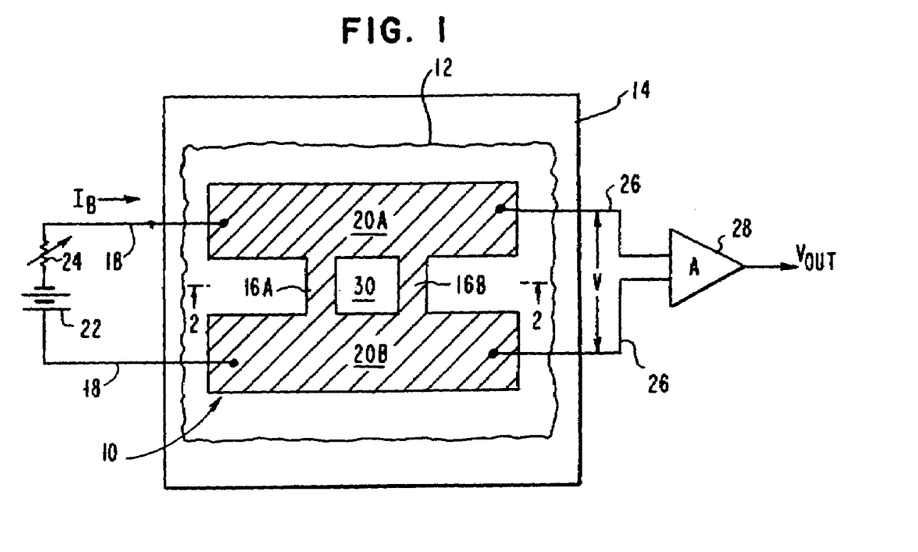
FIG. 1 is a top view of a SQUID device made in accordance with the present invention, this device being comprised of weak superconducting links formed in a high $T_c$ superconductor, and providing successful DC SQUID operation at temperatures in excess of 60° K.

These concepts can be more readily explained by specific examples, such as the DC SQUID device of FIG. 1. In this FIGURE a superconducting SQUID, generally designated 10, is formed in a layer 12 of high $T_c$ superconducting material. Layer 12 is contained in a refrigerator 14, of a type well known in the art. Refrigerator 14 is used to maintain the layer 12 at cryogenic temperatures greater than 30° K. The SQUID is comprised of a superconducting loop having two weak superconducting links 16A and 16B therein. These weak links are formed by constricted portions of superconducting material.

However, in an alternate technique, the ion beam can be used to lower $T_c$ in a region between two high $T_c$ superconductors. In this FIGURE, the hatching is used to indicate superconducting portions of layer 12, while the regions of layer 12 which are not cross hatched represent regions that are nonsuperconducting. Al leads 18 are ultrasonically bonded to the superconducting portions 20A and 20B of the SQUID and are connected to a current source comprising a battery 22 and a variable resistor 24. This current source is used to provide the SQUID bias current $I_B$. Leads 26 are also connected to superconducting regions 20A and 20B and to a voltage amplifier 28 in order to detect the voltage V across the SQUID.

Figure 2:
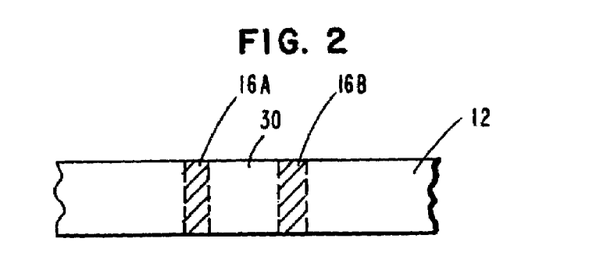
FIG. 2 is a side elevational view of a portion of the structure of FIG. 1 taken along the line 2—2 thereof, and more particularly showing some of the superconducting and nonsuperconducting regions of material 12 in which the SQUID device is formed.

FIG. 2 is a side elevational view of a portion of the SQUID device of FIG. 1, and more clearly illustrates the substantially planar superconducting and nonsuperconducting regions of the SQUID loop. Due to the high energy bombardment of the material 12, portions of it will be changed to a nonsuperconducting state and, if the dosage is sufficient, to an insulating state. For this purpose, a patterned masking layer (for example, gold) is used to protect those areas of layer 12 which are to remain superconducting. Thus, portions of layer 12 corresponding to the weak links 16A and 16B, as well as the superconducting loop portions 20A, and 20B will be protected by the mask. The interior region 30, shown as a square in FIG. 1, and the regions surrounding 16A, 16B, 20A and 20B are not protected and are therefore rendered nonsuperconducting by the high energy ion beam. In this manner, a superconducting loop comprising portions 16A and 16B, 20A and 20B will be formed through the entire depth of layer 12. Of these superconducting portions, 16A and 16B are weak superconducting links supporting currents therein so that a SQUID device is created. As is apparent from FIG. 2, this SQUID is essentially planar. When the high energy ion bombardment occurs, it is possible that there could be dimensional changes in the areas which are irradiated, causing the top surface of layer 12 to vary somewhat from a completely planar geometry. However, such variations will be quite small so that a substantially planar structure is formed.

In FIG. 2, it should be understood that the high $T_c$ materials can be bulk materials or films formed on a substrate. In these FIGURES, the substrate is not shown, although substrates such as MgO, thermally grown $SiO_2$, sapphire, etc. can be used.

Figure 3:
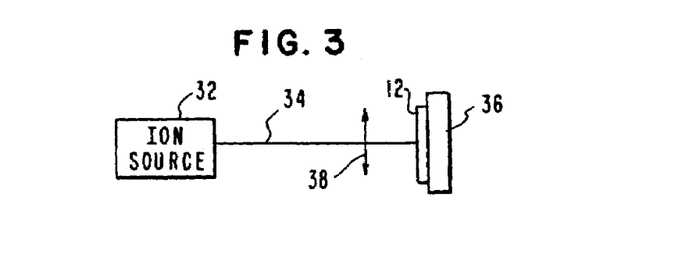
FIG. 3 is a schematic illustration an apparatus suitable for providing local modification of the properties of high $T_c$ superconductors in order to provide planar structures such as the SQUID of FIG. 1.

To locally alter the properties of the high $T_c$ material 12, a directed beam of energy is used. One such beam is an ion beam, which is conveniently provided by a ion beam system, systematically illustrated in FIG. 3. In this system, an ion source 32 provides a beam 34 of ions which is directed to the high $T_c$ material 12, located on the substrate 36. It is understood that the ion source generally includes an analyzing magnet so that the ion beam striking the superconductor is comprised of only the desired ions. The arrow 38 indicates that the beam 34 be scanned across different portions of superconductor 12 using, for example, well known electrostatic deflection means. The total ion dose, type of ion, and energy of the incident ions will be illustrated for several examples, to be described later.

Figure 4:
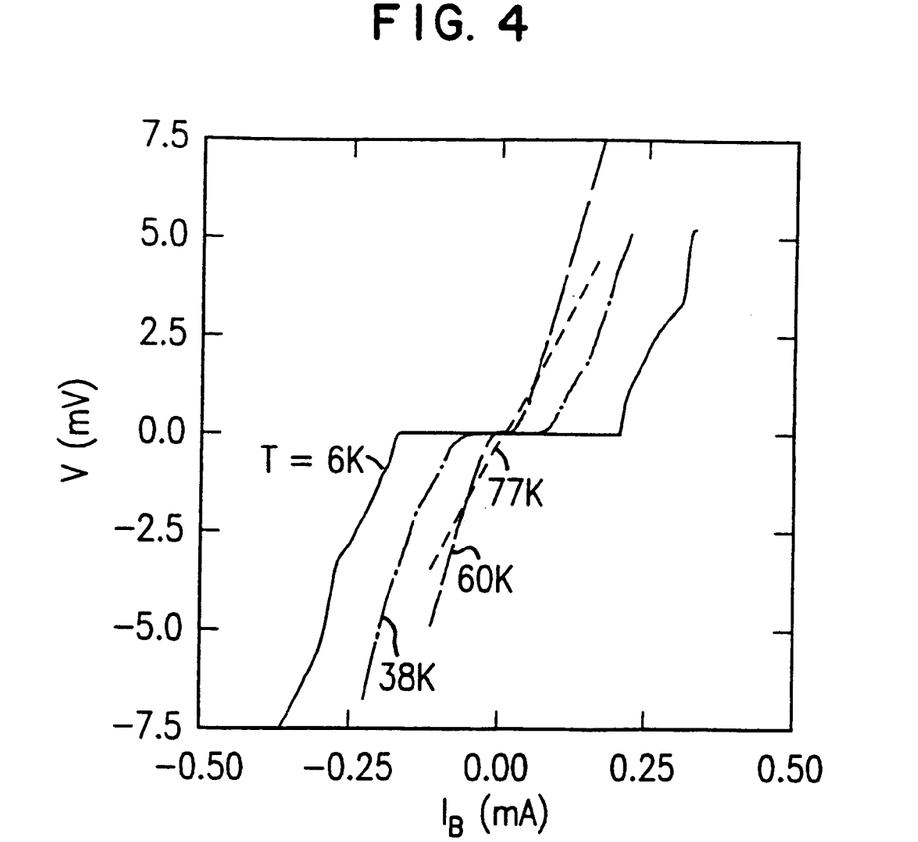
FIG. 4 is a voltage versus current plot for the SQUID device shown in FIGS. 1, 2. This device was measured at four different temperatures: 6, 38, 60°, 77° K. This lot indicates the weak link behavior of the weak links 16A and 16B (FIG. 1), and shows the presence of super currents at high temperatures.

FIG. 4 shows the I–V curve for the SQUID of FIG. 1 at four temperatures: 6°, 38° 60° and 77° K. These voltage-current curves show the presence of a super current at temperatures up to and including 60° K. This DC SQUID actually showed a super current at 68° K. The $I_B$ vs. V curve at 77° K. with the SQUID immersed in liquid nitrogen had no super current but showed a slight decrease in resistance for $I_B$<3 $\mu$A, which would be characteristic of a small part of the SQUID loop being superconducting, but not all of the loop.

Figure 5:
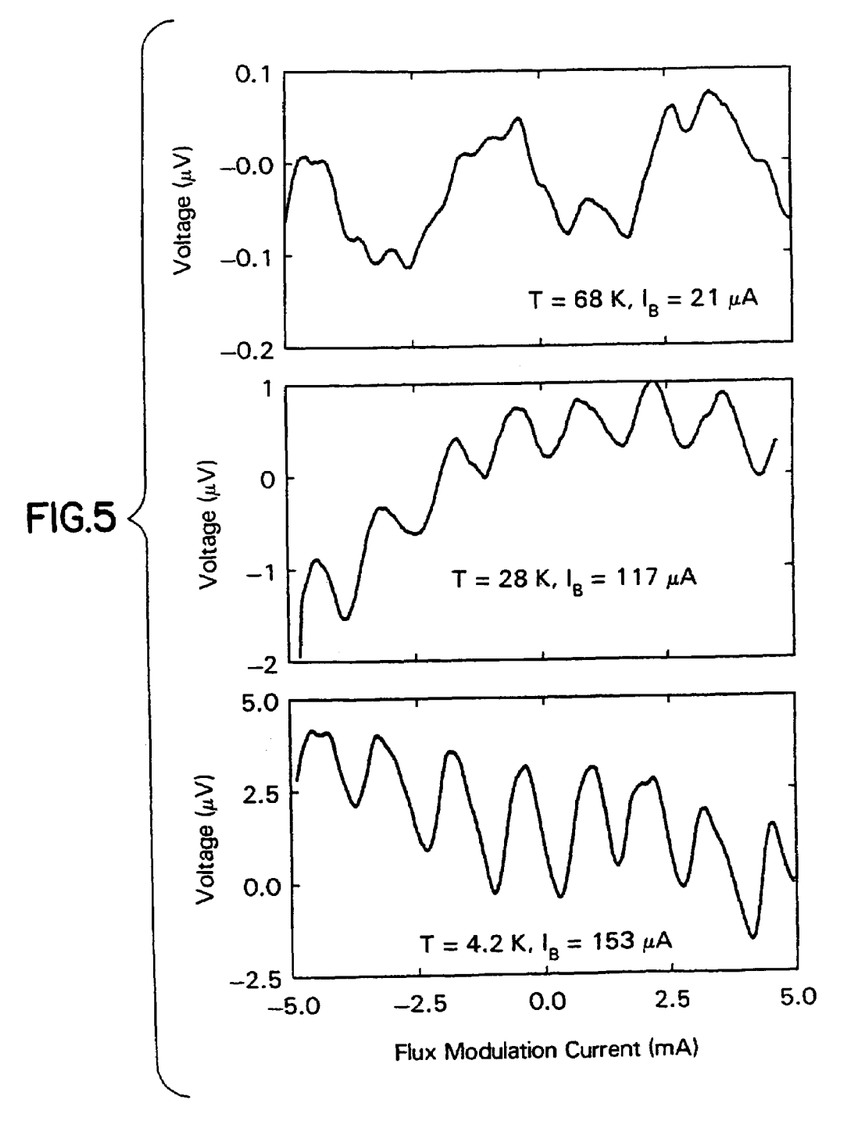
FIG. 5 is a plot of voltage versus flux modulation current (or flux) associated with a magnetic field coupling the SQUID of FIG. 1, and illustrates the achievement of successful SQUID operation at three different temperatures: 4.2° K., 28° K., and 68° K.

FIG. 5 is a plot of voltage V across the SQUID of FIG. 1 as a function of the current (or flux) through a coil which is used to produce a magnetic field that intersects the SQUID loop. Voltage curves are shown for three different temperatures: 4.2°, 28°, and 68° K. As is well known in the art, the periodic behavior of a DC SQUID to a ramp of magnetic flux is a measure of the successful operation of the SQUID. As is apparent from FIG. 5, the voltage V across the DC SQUID is periodic with the applied magnetic flux (current) at the three measured temperatures indicating successful SQUID operation. Due to the fact that the weak links 16A and 16B are slightly different, a small asymmetry is apparent in the voltage versus flux curves of FIG. 5. The actual current needed per flux quantum $I_o$ intersecting the SQUID loop is smaller at low temperatures because the large pads 20A and 20B screen the magnetic field from the pad center and increase the field near the pad edges, where the SQUID is located, causing a "flux-focussing" effect. As the temperature is increased, the screening of the pads becomes weaker and the super $I_o$ increases. This "flux-focussing" effect increases the magnetic field sensitivity of the SQUID by almost a factor of 50.

Figure 6:
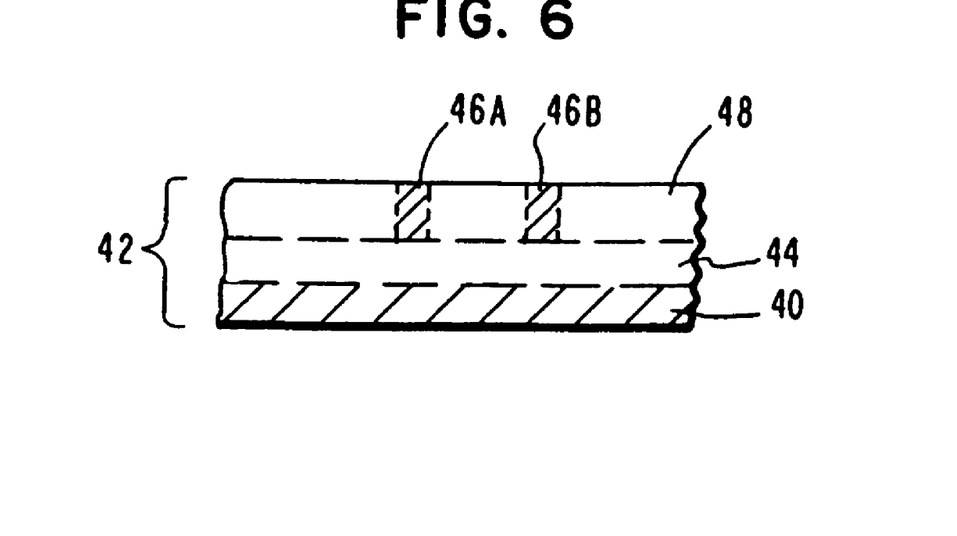
FIG. 6 schematically illustrates a device, such as the SQUID of FIG. 1, formed in a high $T_c$ superconductor, wherein a ground plane is also formed in the high $T_c$ superconductor.

In the SQUID characterized by the data of FIGS. 5 and 6, the weak link portions 16A and 16B of the SQUID had width of 17 microns and a length 40 microns. The area 30 was 40×40 microns, thereby creating a superconducting loop 40×40 microns. The thickness of the high $T_c$ superconductor 12 was about 1 micron. Layer 12 was implanted by oxygen ions with a dose of about $5 \times 10^{15}$ ions/cm$^2$, the ion energy being about 250 KeV. Superconductor 12 was a film having a nominal composition $YBa_2Cu_3O_y$, where y is sufficient to satisfy the valance commands of the composition. Superconductivity was destroyed in the layer surrounding the device without actually changing the thickness of the remaining layer resulting in a planar SQUID structure.

Normally, it would not be expected that a weak link having these dimensions would operate as weak link. It appears that there may be superconducting tunnel junctions across the grains that are present in these weak links, allowing a Josephson tunnel current to pass between the regions 20A and 20B of the superconducting loop. However, the present technique can be used to make very fine linewidths for constriction weak links, especially as the quality of the high $T_c$ material increases. Thus, the presence of barriers across grain boundaries is not a necessity in order to provide a weak superconducting link in accordance with this invention.

Figure 7:
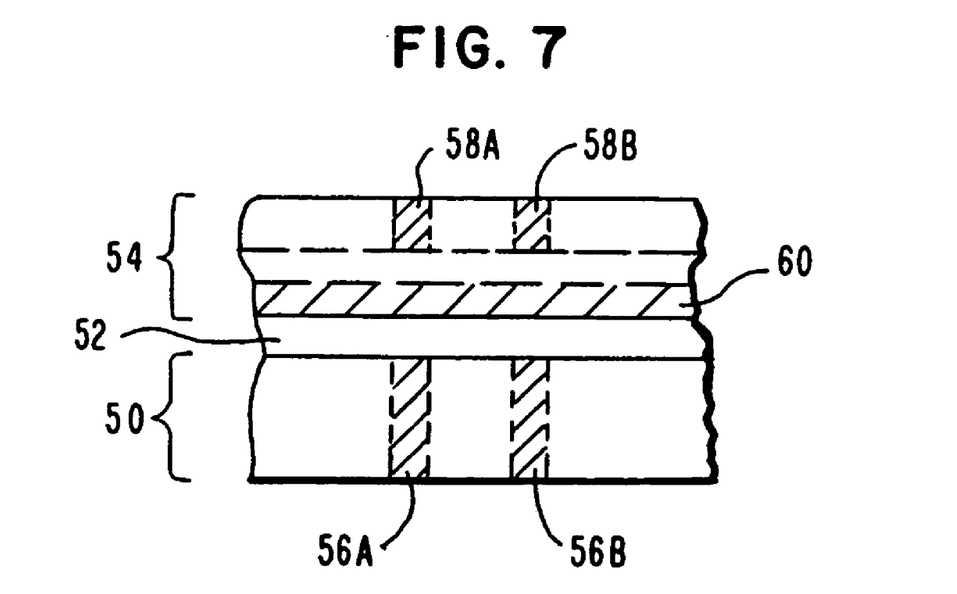
FIG. 7 illustrates a 3D structure comprised of two layers of high $T_c$ superconducting material separated by an insulating layer, wherein devices can be formed in one or both of the high $T_c$ superconductor layers.

FIGS. 6 and 7 show additional types of structures that can be made by the present technique. For many devices, it is desirable to have a ground plane which is electrically isolated from the device. This often requires two additional layers in the structure. However, this is easily accomplished in the structure of FIG. 6, in which region 40 of the high $T_c$ superconductor 42 remains superconducting, while the region 44 has been rendered nonsuperconducting and insulating by ion bombardment. The superconducting SQUID device is then formed in the top remaining surface of material 42, in the same manner that was used to form the SQUID of FIG. 1. In this instance, the ion energy is adjusted so that the superconducting properties of material 42 will be affected only down to the top surface of the insulating portion 44. Thus, cross-hatched regions 46A and 46B represent conducting weak link regions while the surrounding unshaded portions 48 have been ion implanted and are nonsuperconducting. As is known in the general art of ion beam implantation, the energy of the ions determines their penetration depth into a material. This fact is utilized to leave the bottom portion 40 of the high $T_c$ superconductor in a superconducting state, in order to create the insulating region 44. Insulator 44 thereby provides the necessary electrical isolation between the SQUID device and the ground plane 40.

FIG. 7 shows a multilayer structure providing a 3D device configuration. In this structure, a first high $T_c$ superconductor 50 has formed thereon an insulating material 52 such as, for example, $SiO_2$. Another high $T_c$ superconductor 54 is in turn formed on insulator 52. Device structures can be formed by the present process in either or both of the high $T_c$ materials 50 and 54. Thus, weak superconducting links 56A and 56B are shown in layer 50, while link 58A and 58B are shown in layer 50. Additionally, layer 54 includes a superconducting ground plane 60. In FIG. 7 the superconducting regions of layers 50 and 52 are shown with cross hatching, while the remaining portions of these layers are insulating, and therefore nonsuperconducting.

FABRICATION METHODS

As was indicated previously, ion implantation is an effective way to provide a high energy beam which will change the superconducting properties of these materials in order to render portions thereof nonsuperconducting. A damage mechanism is used in which the material can be changed from a crystalline to an insulating amorphous state. If a lesser dosage is used, or if less heavy ions are used, the material can still remain electrically conducting, but lose its superconductivity.

Generally, the technique uses a conventionally patterned masking layer, such as gold, to prevent the implantation of ions in regions of the superconducting material where the high $T_c$ property is to be maintained. The thickness of the mask is chosen in accordance with the type of implanting ion and the energy of that ion. Generally, the mask thickness is made about two-three times the projected range of the implanted ion. For example, for a 250 KeV oxygen ion, a gold mask can be used having a thickness of about 500 nm. Other masks that were used included a 1 µm resist layer on 500 nm gold film.

Following implantation, any organic masking material used to define the pattern in the ion implantation mask is removed, as by ashing. The metal masking material is then etched away by a suitable technique, such as ion milling.

The following table will illustrate the successful implantation of several high $T_c$ superconductors in order to provide nonsuperconducting regions therein. In many of these materials, the listed dosage was sufficient to cause a crystalline to amorphous transition to occur, rendering the material insulating and nonsuperconducting. Generally, for these high $T_c$ copper oxide materials, it has been found that the transition to nonsuperconducting occurs with a very low ion dose, approximately $10^{13}$ oxygen 16 ions/cm$^2$. However, a dose 1–2 orders of magnitude higher is generally required to make the high $T_c$ material very insulating, i.e., where the material has a sheet resistivity greater than 10 ohms/square.

In this table, nominal compositions are presented for both the Y—Ba—Cu—O system and the La—Sr—Cu—O system. The column headed "STATE" is the state of the implanted material. If the implanted material retains its metallic characteristic but loses its superconductivity, its state is turned "normal", while if the material undergoes a more significant conversion, it will become insulating, and lose its crystalline structure. In one sample, the material become highly resistive, but not quite insulating, i.e., it had a resistivity less than $10^4$ ohms/square. Sample 5336A was given a 2-step treatment including a first implantation followed by a second implantation at a higher energy and dosage.

TABLE

| SAMPLE | DOSE ion/cm² | | ION | ENERGY | STATE | Nominal Composition | | | |
|---|---|---|---|---|---|---|---|---|---|
| | | | | | | Y | Ba | Cu | O* |
| 5332A | $1.5 \times 10^{14}$ | | 0 | 500 KeV | normal | 0.23 | 0.63 | 1 | 3.6 |
| | $4 \times 10^{14}$ | | 0 | 500 KeV | high-resistance | | | | |
| 5328D | $1 \times 10^{14}$ | | As | 1 MeV | insul. | 0.25 | 0.45 | 1 | 2.6 |
| 5334C | $1 \times 10^{14}$ | | As | 1 MeV | insul. | 0.30 | 0.76 | 1 | 5.1 |
| 5336A | $6 \times 10^{14}$ | 1 MeV | As | | insul. | 0.43 | 0.46 | 1 | 4.0 |
| | followed by | | | | | | | | |
| | $1 \times 10^{15}$ | 2.3 MeV | As | | | | | | |
| 5337E | $1 \times 10^{15}$ | | As | 2.3 MeV | insul. | 0.41 | 0.40 | 1 | 1.7 |
| | | | | | | La | Sr | Cu | O |
| 5319D | $1 \times 10^{14}$ | | 0 | 250 KeV | insul. | 1.75 | 0.04 | 1 | N/A |
| 5323A | $5 \times 10^{15}$ | | 0 | 1 MeV | insul. | | NA | | |
| 5324B | $4.6 \times 10^{15}$ | | 0 | 1 MeV | insul. | 1.54 | 0.15 | 1 | 4.1 |

*estimated

In the practice of this invention it is possible to provide device structures using high $T_c$ material which would otherwise be very difficult to fabricate. In particular, typical weak link configurations of superconductor-insulator-superconductor layers where the insulator is 1–2 nm thick, would be very difficult to fabricate using high $T_c$ superconducting oxides. Most insulating films 1–2 nm thick will crack and short out the device when thermally cycled from room temperature up to the 900° C. temperatures required to form a superconducting oxide counter electrode. Consequently, the coplanar weak link structures of the present invention offer significant processing and device advantages. Of course, the fabrication of essentially coplanar structures allows for more direct processing of subsequent layers which could not be obtained if the SQUID were formed by techniques such as ion milling, etc.

What has been described is a unique device configuration comprising a high $T_c$ SQUID and processes for making this device. It will be appreciated by those of skill in the art that the type of ion chosen and its dosage can be regulated to alter the amount of damage produced in the high $T_c$ material in order to change the properties of that material. Similarly, the energy of the accelerating ions can be adjusted to change the depth of the deposited ions in order to create various layers having different properties within the same high $T_c$ superconductor. Typically, energies in the range 250 KeV-2 or 3 MeV will provide good results with these high $T_c$ oxide superconductors.

While the invention has been described with respect to particular embodiments thereof, it will be appreciated by those of skill in the art that variations can be made therein without departing from the spirit and scope of the present invention. For example, the invention is intended to encompass all high $T_c$ superconductors of the type discovered by Bednorz and Mueller, these materials typically being oxide superconductors having a layer-like structure and exhibiting $T_c$ in excess of 30° K. The formation of these materials in both film and bulk form has been extensively described in the literature, and the present invention can be used with any of these materials regardless of the method by which they are formed. Further, any type of high energy beam can be utilized, as long as the beam produces sufficient damage in the superconductor to locally change its superconducting properties. Still further, the beam can be used to produce a weak link by altering the $T_c$ of the implanted region (having the altered region with a lower $T_c$, or even in a normal state). It is not necessary to totally change the damaged region to an insulating state.

What is claimed is:

1. A method for forming a superconductive device operating at temperatures in excess of 40° K., including the steps of:
   directing an energy beam onto selected regions of a layer of high $T_c$ superconducting material, said energy beam producing sufficient damage in the irradiated portions of said layer of high $T_c$ superconducting material to render said irradiated portions nonsuperconducting, the surface of said irradiated regions being substantially coplanar with the remaining portions of said layer of high $T_c$ superconducting material, and
   continuing said irradiation at selected portions of said layer of high $T_c$ superconducting material to form therein a continuous path exhibiting superconductivity at temperatures in excess of 40° K., the portions of said layer surrounding said continuous path of superconducting material being nonsuperconducting as a result of said irradiation.

2. The process of claim 1, where said superconducting path forms a loop.

3. The process of claim 1, where said energy beam is comprised of ions.

4. The process of claim 3, where said ions impinge with a sufficient energy make said irradiated regions of said layers insulating.

5. The process of claim 1, where said irradiation is to a depth in said layer to produce a buried region which is nonsuperconducting.

6. A method for forming a superconductive structure in a layer of high $T_c$ copper oxide superconductive material, including the steps of
   forming a layer of high $T_c$ superconductive copper oxide,
   directing an energy beam to said layer to create nonsuperconductive regions thereby patterning said layer into first regions which are superconductive and second regions which are nonsuperconductive, said first and second regions being substantially coplanar and adjacent.

7. The method of claim 6, where said energy beam is comprised of ions.

8. The method of claim 6, where said energy beam is scanned across said layer to produce said nonsuperconductive second regions therein.

9. The method of claim 6, where said layer is patterned to produce a continuous first superconductive region surrounded by nonsuperconductive second regions.

10. A method for forming a device in a layer of high $T_c$ superconductive material, including the steps of directing an energy beam to a region of a layer of high $T_c$ superconductive material, said beam having an energy sufficient to render said region nonsuperconductive, and continuing the irradiation of said layer by said energy beam to produce a superconductive path for the flow of electrical current therein, said path being surrounded by irradiated nonsuperconductive regions of said layer which are substantially coplanar with said superconductive path.

11. The method of claim 10, where said path is part of a Superconducting Quantum Interference Device (SQUID).

12. The method of claim 10, where said supercurrent includes a Josephson current.

13. The method of claim 10, where said energy beam is an ion beam.

14. The method of claim 10, where said irradiation produces a closed loop of superconductive material in said layer.

15. A method for forming a patterned structure in a layer of copper oxide material including the steps of irradiating said layer with an energy beam to render irraditated regions thereof nonsuperconducting, said superconducting and nonsuperconducting regions being substantially coplanar.

\* \* \* \* \*